POINT CONTACT SEMICONDUCTOR DEVICES AND METHODS OF MAKING SAME

Filed Aug. 23, 1952

INVENTORS.
JUSTICE N. CARMAN, JR.,
ELMO E. MAIDEN,
BY Seymour M. Rosenberg
ATTORNEY.

United States Patent Office 2,818,536

Patented Dec. 31, 1957

2,818,536

POINT CONTACT SEMICONDUCTOR DEVICES AND METHODS OF MAKING SAME

Justice N. Carman, Jr., and Elmo E. Maiden, Los Angeles, Calif., assignors, by mesne assignments, to Hughes Aircraft Company, a corporation of Delaware Application August 23, 1952, Serial No. 306,014

8 Claims. (Cl. 317—236)

This invention relates to point contact semiconductor devices and more particularly to point contact semiconductor devices which include a semiconductor crystal element having a rectifying barrier therein, the barrier being formed by doping a region of the crystal element with an active impurity from the associated whisker element.

Monatomic semiconductors, such as germanium and silicon, have been found to be extremely useful in electrical devices for translating or controlling electromagnetic energy, such as light energy or electrical signals. In particular, these semiconductors have been utilized, in the prior art, for sensing light energy, and for generating, amplifying and modulating electrical signals.

Basic to the theory of operation of semiconductor devices is the concept that current may be carried in two distinctly different manners; namely, "conduction by electrons" or "excess electron conduction," and "conduction by holes" or "deficit electron conduction." The fact that electrical conductivity by both of these processes may occur simultaneously and separably in a semiconductor specimen affords a basis for explaining the electrical behavior of semiconductor devices. One manner in which the conductivity of a semiconductor specimen may be established is by the addition of 'active impurities" to the base semiconductor material.

In the semiconductor art, the term "active impurities" is used to denote those impurities which affect the electrical rectification characteristics of monatomic semiconductor material, as distinguishable from other impurities which have no appreciable effect upon these characteristics. Generally, active impurities are added intentionally to the base semiconductor material for producing single crystal ingots having predetermined electrical characteristics. In many instances, however, certain of these impurities may be found in the original base material.

Active impurities are classified as either donors, such as antimony, arsenic, bismuth and phosphorous, or acceptors, such as indium, gallium, thallium, boron and aluminum. A region of monatomic semiconductor material containing an excess of donor impurities and yielding an excess of free electrons is considered to be an impurity-doped N-type region, while an impurity-doped P-type region is one containing an excess of acceptor impurities resulting in a deficit of electrons, or stated differently, an excess of holes. In other words, an N-type region is one characterized by electron conductivity, whereas a P-type region is one characterized by hole conductivity.

P-type regions in monatomic semiconductors also have been produced in the prior art by "heat quenching" a region of a donor impurity doped N-type semiconductor specimen. According to this technique, a specimen of extrinsic or doped N-type germanium is heated to a value of temperature above 500° C., and is then rapidly cooled. In this manner the molecular structure of the semiconductor material is rearranged so that the specimen exhibits P-type characteristics although no acceptor impurity, per se, has been added to the base material. In addition, it has been found that P-type semiconductor material produced by "heat quenching" may be reconverted to N-type by merely re-heating and annealing the material. A more rigorous theoretical treatment of this phenomenon may be found in the book entitled "Electrons and Holes in Semiconductors" by Shockley, published in 1950 by D. Van Nostrand, Inc., of New York.

Among the most notable of the electrical devices employing monatomic semiconductor material are the point contact diodes and transistors. In these devices one or more conductive wires or "whisker" elements of relatively small cross sectional area are stressed against a crystal element of monatomic semiconductor material in order to produce a rectifying contact between the crystal and each whisker element.

In the prior art, point contact semiconductor devices are most commonly produced by stressing a whisker element of a resilient material such as molybdenum, platinum, tungsten or the like against a doped N-type germanium specimen. An electrical current is then passed through the combination of the whisker element and the germanium specimen in order to "form" the electrical rectification characteristics of the device by creating in the specimen a "heat quenched" P-type region immediately adjacent the area of contact of the whisker element with the specimen.

One of the principal disadvantages of point contact semiconductor devices produced by this prior art technique is that the P-type region of the device may be reconverted to an N-type region if the device is subjected to reasonably high temperatures. In addition, the rectification characteristics of the devices are inherently limited by the relatively small maximum forward currents which the devices are capable of passing. For example, in the prior art point contact semiconductor diodes, it is extremely difficult to obtain good rectification characteristics and forward currents in excess of ten milliamperes at one volt, and the average forward current at a potential of one volt is usually of the order of four milliamperes.

The present invention, on the other hand, discloses point contact semiconductor devices which obviate the above and other disadvantages of the prior art point contact semiconductor devices. According to the basic feature of this invention, a portion of an N-type semicondutor starting specimen is converted to semiconductor material of the other conductivity type by doping this region with atoms of an acceptor impurity from the metallic conductive whisker element engaging the specimen. More particularly, a resilient whisker element, including an active impurity of the acceptor type, is stressed at a substantially point contact against an extrinsic or doped semiconductor crystal element including an active impurity of the donor type, and an electrical forming current is passed through the elements to produce a doped region, including an excess of acceptor atoms, in the portion of the crystal element adjacent the point contact.

According to a preferred method of the present invention, an indium-plated whisker element is utilized for establishing a doped P-type region in a doped N-type semiconductor starting specimen. In this embodiment of the invention, the indium may be plated on a conventional resilient whisker element prior to use in a semiconductor device, or, on the other hand, the indium may be diffused into the adjacent surface region of the whisker element after being plated thereon.

According to other embodiments of this invention, point contact semiconductor devices are provided wherein the whisker elements include a resilient metallic material and an acceptor impurity, such as aluminum, gallium or thallium, for establishing a doped P-type region in the N-type semiconductor specimen.

In all of the above-mentioned semiconductor devices made according to the methods of this invention, the hole injection from the P-type region to the N-type region, when the devices are forward biased, is greatly increased over that of the prior art point contact semiconductor devices due to the establishment of the P-type region by doping the crystalline structure of the region with excess acceptor atoms. As a result, the point contact semiconductor devices of this invention possess exceptional electrical characteristics and exhibit forward currents in excess of ten times those normally attainable in the prior art. In addition, the semiconductor devices of this invention exhibit excellent rectification ratios and relatively high peak inverse voltages.

The whisker elements employed in all of the point contact semiconductor devices of this invention are thus characterized by two basic physical properties, namely, they are mechanically resilient, and they include an acceptor impurity for establishing a doped P-type region in the associated semiconductor specimen.

It is, therefore, an object of this invention to provide point contact semiconductor devices which include a semiconductor crystal element having at least one doped N-type region and at least one doped P-type region.

It is another object of this invention to provide point contact semiconductor devices in which the whisker elements include an active impurity for establishing an impurity doped region of the corresponding conductivity type in an associated semiconductor starting specimen of the opposite conductivity type.

It is an additional object of this invention to provide point contact semiconductor devices by electro-forming at least one whisker element, including an active impurity of the acceptor type, with a semiconductor crystal element including an active impurity of the donor type.

It is still another object of this invention to provide point contact semiconductor devices in which a region of an N-type semiconductor specimen is converted to the opposite conductivity type by doping this region with an active impurity from a contacting whisker element.

It is also an object of this invention to provide point contact semiconductor devices in which a whisker element including an acceptor impurity is utilized for establishing a P-type region in an N-type semiconductor starting specimen.

A further object of this invention is to provide point contact semiconductor diodes in which the whisker element includes an active impurity of the acceptor type for producing an acceptor doped P-type region in a contacting doped N-type germanium starting specimen.

It is still an additional object of this invention to provide point contact semiconductor diodes in which an indium-plated molybdenum whisker element is stressed against and formed with an N-type germanium crystal element to produce in the crystal element an indium-doped P-type region adjacent the whisker element.

It is still further an object of this invention to provide methods for producing point contact semiconductor devices by doping a region of a semiconductor starting specimen of one conductivity type with an acceptor impurity from an associated whisker element, in order to convert this region to the opposite conductivity type.

It is another object of this invention to provide methods for producing point contact semiconductor diodes by stressing a whisker element, including an active impurity of the acceptor type, against a semiconductor specimen, including an active impurity of the donor type, and passing an electrical forming current therethrough.

An additional object of this invention is to provide methods for producing point contact semiconductor devices by forming a metallic resilient whisker element, including an active impurity of the acceptor type with an N-type semiconductor starting specimen.

It is another object of this invention to provide methods for producing point contact semiconductor diodes by stressing an indium-plated molybdenum whisker element against an N-type germanium starting specimen, and passing an electrical current therethrough to convert the region of the specimen adjacent the whisker element to indium-doped P-type germanium.

The novel features which are believed to be characteristic of the invention, both as to its organization and method of operation, together with further objects and advantages thereof, will be better understood from the following description considered in connection with the accompanying drawings in which the invention is illustrated by way of example. It is to be expressly understood, however, that the drawings are for the purpose of illustration and description only, and are not intended as a definition of the limits of the invention.

Figures 1, 2, 3, 4, 5, 6, 7:
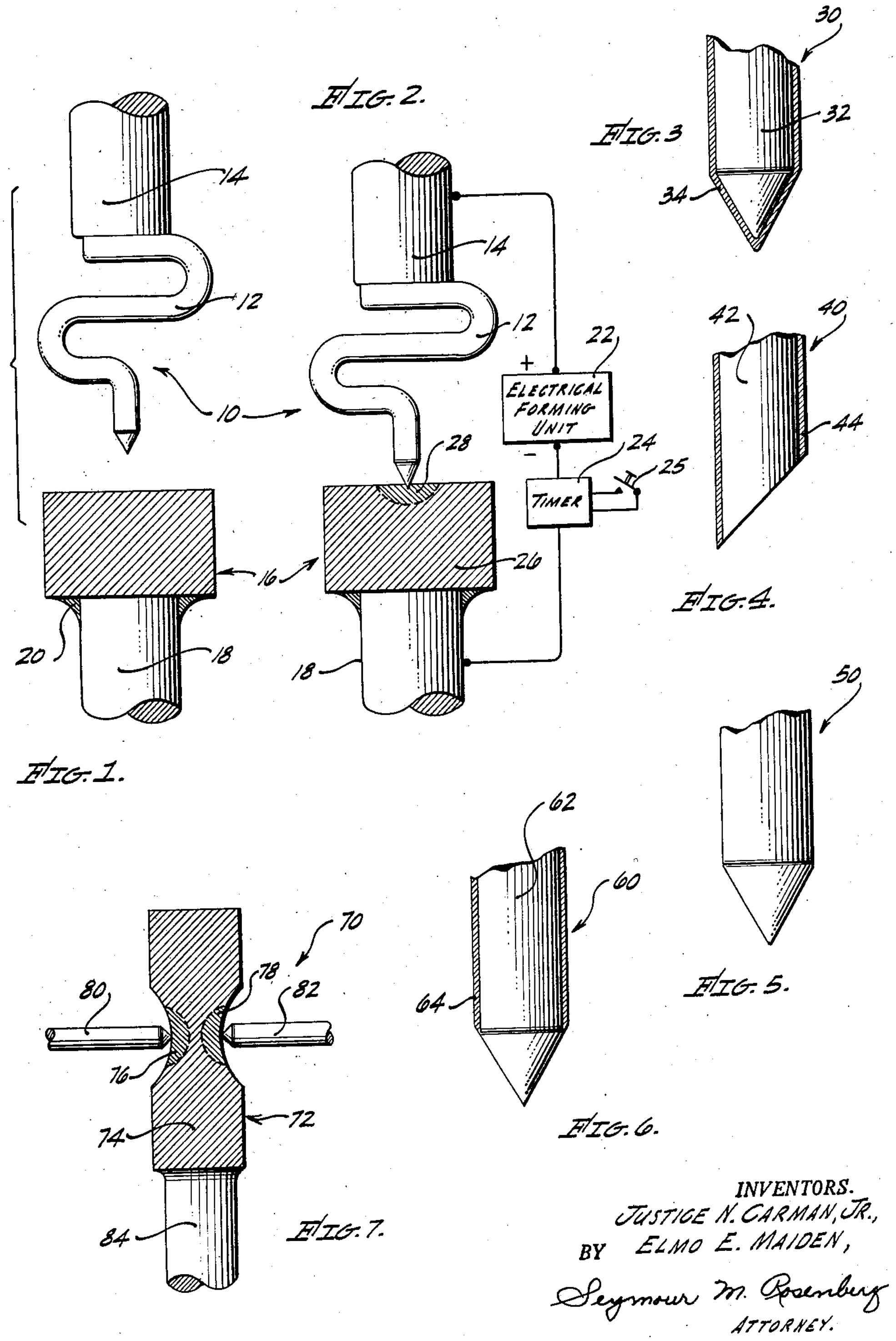
Fig. 1 is a schematic diagram, partly in section, of a point contact semiconductor diode in an intermediate stage of production according to the methods of this invention.
Fig. 2 is a schematic diagram, partly in section, of a point contact semiconductor diode, according to the present invention, together with the circuitry for forming the diode.
Fig. 3 is a sectional view of a portion of a whisker element, including an active impurity, which may be utilized in the semiconductor articles of this invention.
Figs. 4, 5 and 6 are sectional views of other forms of whisker elements, according to the present invention.
Fig. 7 is a schematic diagram, partly in section, of a point contact semiconductor transistor according to the present invention.

For purposes of clarity, the invention will be disclosed in connection with the production of point contact semiconductor devices in which germanium is the monatomic semiconductor material, it being expressly understood that the invention is equally applicable to the utilization of silicon as the semiconductor starting material.

Referring now to the drawings, wherein like reference characters designate like or corresponding parts throughout the several views, there is shown in Fig. 1 a point contact semiconductor diode, generally designated 10, in an intermediate stage of production according to the methods of this invention. Diode 10 includes two basic components, namely, a whisker component including a whisker element 12 connected at one end thereof to an associated electrode 14, and a crystal component including a germanium crystal element 16 and an associated electrode 18.

Crystal element 16 is preferably a single crystal of N-type germanium including an active impurity of the acceptor type. Crystal element 16 may be ohmically connected to its associated electrode 18 in any conventional manner known to the art. As shown in Fig. 1, for example, electrode 18 is connected to crystal element 16 by solder 20. In addition, crystal element 16 preferably has been etched in any conventional manner known to the art.

Whisker element 12 is preferably spot welded at one end thereof to its associated electrode 14, substantially as shown. The other end of whisker 12 is ground or cut to a point and is positioned adjacent the upper surface of crystal element 16, as viewed in Fig. 1, prior to the establishment of the point contact between the crystal and whisker elements of the device. In addition, whisker element 12 is preferably formed to have a configuration which imparts greater spring-like characteristics or resilience to the element. Although shown in Fig. 1 to be substantially S-shaped, it is to be understood that the whisker element may have any of the conventional configurations known to the art.

Whisker element 12 is composed of a metallic resilient material and includes an active impurity of the type opposite to that utilized for establishing the conductivity of germanium crystal element 16. Accordingly, since crystal element 16 is composed of N-type germanium or, in other words, includes an excess of donor atoms, whisker element 12 includes an active impurity of the acceptor type. The specific acceptor impurities which may be utilized in whisker element 12 and the manner in which they are included in the whisker element will be described later in detail.

Whisker element 12 of diode 10 is now moved into engagement with crystal element 16 and is stressed thereagainst at a substantially point contact and with a predetermined force, by a diode assembling apparatus, not shown. This stressing operation may be performed in any of several manners known to the art, one of which is set forth in copending applications S. N. 268,385, filed January 9, 1952, by Justice N. Carman, Jr., and entitled "Methods and Apparatus for Assembling Semiconductor Devices." It is clear, of course, that the term "point contact" is merely a term utilized in the art to describe the relative size of the contact area between the whisker and crystal elements with respect to the cross-sectional area of the whisker element. In practice, the "point contact" has finite physical dimensions, and covers an area having a diameter of the order of one to several ten-thousandths of an inch.

After crystal element 16 has been properly contacted by whisker element 12, the semiconductor device is prepared for an electro-forming operation in order to establish the physical and electrical characteristics of the device in accordance with the methods of this invention.

Referring now to Fig. 2, there is shown one form of apparatus which may be employed in carrying out the forming operation according to the methods of this invention. This apparatus comprises a series electrical circuit, including an electrical forming unit 22 and a timer 24, connected between electrodes 14 and 18, respectively, of diode 10. Timer 24 has an associated switch 25 connected thereto and may be any conventional electronic or electromechanical timing mechanism which is actuable for closing an electrical circuit for a predetermined time interval. Since numerous timers of this type are well known to the art, further description of timer 24 is considered unnecessary.

The primary function of forming unit 22 is to cause sufficient forward current to flow through the point contact of the semiconductor device of this invention to establish the physical and electrical rectification characteristics of the crystal element. Accordingly, forming unit 22 may merely include a source of direct current potential, or on the other hand, may be any one of several more complex electrical forming units known to the art. One suitable forming unit is described in copending application S. N. 202,021, filed December 21, 1950, by Jack F. Roach and entitled "Methods and Circuits for Welding Small Objects."

In order to most clearly illustrate the phenomenon which occurs during the forming operation on the semiconductor devices of this invention, it will be assumed that germanium crystal element 16 includes an excess of donor atoms and is, therefore, N-type germanium, and that whisker element 12 includes an active impurity of the acceptor type.

When switch 25 is closed, forming unit 22 applies a potential between electrodes 14 and 18, the potential at electrode 14 being positive with respect to the potential at electrode 18. Accordingly, an electrical current flows through whisker element 12, the contact area between the crystal and whisker elements, and crystal element 16. Since crystal element 16 and whisker element 12 have relatively large cross-sectional areas in comparison with the contact area between the elements, it is clear that the highest impedance to the flow of forming current is at the point contact and the adjacent regions of the whisker and crystal elements. It follows then that the maximum electrical power dissipation will occur at the point contact.

By furnishing a current of the order of 500 milliamperes to diode 10 for approximately one-tenth of a second, the electrical energy dissipated as heat in the region of the contact area between the whisker and crystal elements will be sufficient to spread acceptor atoms from the whisker element through the adjacent region of crystal element 16, thereby converting this region from N-type germanium to a region of acceptor impurity doped P-type germanium.

There is some question as to the precise nature of the phenomenon which occurs at the point contact during the electrical forming operation. According to one theory, it is considered that the heat dissipated by the forming current melts a relatively small portion of the whisker element point, including the acceptor impurity therein. The molten tip of the whisker element, in turn, wets and melts or dissolves the region of the germanium crystal element immediately adjacent the contact area, thereby permitting acceptor atoms from the whisker element to fuse with the molten region of the germanium and convert this region to acceptor impurity doped P-type germanium. According to another theory, it is considered that acceptor atoms from the molten tip of the whisker element adjacent the point contact are diffused into the adjacent region of the germanium specimen. Although there are arguments which lend credence to each of these theories, it appears probable that the acceptor impurity doped P-type region in the crystal element is produced principally by fusion of acceptor atoms with molten germanium, and that diffusion also contributes, but to a lesser extent, to the establishment of the P-type region within the germanium crystal. Whatever the precise nature of this phenomenon may be, it has been definitely established that the P-type regions thus produced contain germanium having an excess of acceptor atoms and exhibit notably superior "hole conduction" and "hole injection" characteristics in comparison with the best results obtainable in point contact semiconductor devices having P-type regions established by the "heat quenching" technique of the prior art.

Referring again to Fig. 2, the formed semiconductor diode, according to this invention, comprises a crystal element having a first region 26 of N-type germanium, including an excess of donor atoms, and a second region 28 of P-type germanium, including an excess of acceptor atoms, separating whisker element 12 from N-type region 26. As depicted in the drawings, the dimensions of P-type region 28 appear to be of substantially the same order of magnitude as the diameter of the whisker element, or in other words, several thousandths of an inch.

The specific composition of the whisker elements which are employed in the semiconductor articles and methods of the present invention and the manner in which these elements may be produced will now be described.

It may be recalled that the whisker elements utilized in the semiconductor devices of this invention possess two fundamental physical characteristics, namely, they have good metallic resiliency, and include an active impurity of the acceptor type. More particularly, each whisker element includes an acceptor impurity in at least the region of the pointed end.

The methods by which an active impurity may be incorporated into the whisker elements of this invention vary depending upon the specific active impurity which is to be utilized. For example, in most instances it is preferable to add the active impurity to a conventional metallic resilient whisker element. However, certain active impurities, notably aluminum, may be utilized per se as the whisker element. Accordingly, the manner in which each of several different active impurities has been so employed will be described separately.

In order to produce a whisker element including an active impurity of the acceptor type, it has been found preferable to electroplate a relatively thin layer of indium upon a conventional metallic whisker element composed of a suitable resilient material such as molybdenum. The indium plating process may be carried out in any of several conventional manners known to the art, one of which is described on pages 64–66 of the book entitled "Indium" by Maria Ludwick and published by the Indium Corporation of America of New York City. According to this technique, a conventional whisker element is first immersed into a hot alkaline electrolytic cleaning bath for 10 to 20 seconds, rinsed clean in running water and is then indium plated by immersion, as the cathode, in an indium cyanide plating bath. The thickness of the indium plate is not especially critical, a typical value being of the order of several ten-thousandths of an inch.

After plating, the whisker elements may be utilized as described in the point contact semiconductor devices of this invention, or may be further treated by heating in an oil bath or oven in order to diffuse the plated indium into the outer region of the whisker element. For certain applications of the semiconductor devices of this invention it is preferable to utilize this additional diffusion operation, since plated indium is relatively soft, while after diffusion it will be found to have hardened or to have actually alloyed with the outer region of the whisker element.

In a similar manner, whisker elements may be produced by plating thallium or aluminum on a conventional metallic whisker element. One plating solution which has been found suitable for producing thallium plated whisker elements according to the methods of this invention is described in the U. S. Patent Serial No. 2,551,413 to J. M. Booe, entitled "Methods of Producing Silver-Thallium-Indium Alloys," issued May 1, 1951. After plating, the thallium may be diffused into the outer region of the whisker element, substantially as described above for indium.

Whisker elements including an acceptor impurity may also be produced by adding gallium to a conventional whisker element. This may be readily accomplished by merely dipping the pointed end of the whisker element into molten gallium. Since gallium melts at approximately 28° C. and readily wets and adheres to such whisker materials as molybdenum, for example, this process may be carried out under near ambient conditions. In addition, the gallium may then be diffused into the outer region of the whisker element by the application of heat.

Referring now to Fig. 3, there is shown a portion of a whisker element, generally designated 30, which illustrates one form of whisker element point and the associated active impurity region of the whisker element. Whisker element 30 includes a central longitudinal region 32 of a suitable resilient metallic material, and a surface or outer region 34 surrounding region 32 and including an acceptor impurity. The specific composition of region 34 is, of course, dependent upon the active impurity utilized in the whisker eleemnt and the method by which the impurity was added thereto. For example, if the indium plating process set forth above had been carried out on a molybdenum whisker element, region 32 would be molybdenum and region 34 would be indium. If, in addition, the indium had been diffused into the molyddenum, as outlined previously, region 32 would be molybdenum and region 34 would be an alloy of indium and molybdenum.

It has been assumed in the foregoing description that an acceptor impurity has been added to a previously formed and pointed whisker element. In Fig. 3, for example, the active impurity region completely encloses the pointed end of region 32, which corresponds substantially to the original whisker element prior to the addition of the active impurity. It should be understood, however, that an active impurity may be added to a wire of whisker material before the whisker elements are shaped and pointed.

Referring now to Fig. 4, there is shown a portion of a whisker element, generally designated 40, which has been produced by adding an acceptor impurity to a wire of whisker material, after which the wire has been shaped and pointed to produce a whisker element. Thus, whisker element 40 again includes a central longitudinal region 42 of resilient metallic material and an outer region 44, including the acceptor impurity, surrounding region 42. However, since the acceptor impurity in this instance was added prior to the shaping of whisker element 40, the whisker point is produced by cutting the whisker element diagonally in order to insure that the point is within the active impurity region 44.

In all of the above methods for producing whisker elements according to this invention, a resilient metallic material has been employed in order to provide the desired mechanical properties in the whisker element. It may be recalled, however, that certain active impurities, notably aluminum, may be utilized per se as the whisker element in the point contact semiconductor devices of this invention. Referring now to Fig. 5, there is shown a portion of a whisker element, generally designated 50, which has been produced from aluminum. In whisker element 50, the aluminum provides both atoms of an active impurity and the desired mechanical resiliency, thereby complying with the desired physical characteristics of whisker elements suitable for use in this invention. It should be pointed out, however, that in certain high temperature applications of the semiconductor devices of this invention, it is sometimes desirable to plate aluminum whisker elements with a suitable resilient material having a high melting point, such as nickel, in order to provide added resilience to the whisker element. Referring now to Fig. 6, there is shown a portion of a whisker element, generally designated 60, which has been produced by nickel plating an aluminum wire. Whisker 60 includes a central region 62 composed of aluminum and an outer region 64 surrounding region 62 and composed of a metallic material having good mechanical properties, such as nickel.

The methods herein disclosed may also be applied to the production of point contact transistors, according to the present invention, by employing two whisker elements, each including an active impurity of the acceptor type, as the collector and emitter electrodes in order to establish two impurity-doped regions of the associated conductivity type in an N-type germanium crystal element. For example, to produce a P–N–P transistor, two whisker elements, each including an acceptor impurity, may be stressed against and formed with an N-type germanium starting specimen to produce two spaced acceptor impurity doped P-type regions in the N-type starting specimen.

Referring now to Fig. 7, there is shown a point contact semiconductor transistor, generally designated 70, which has been produced by the methods of this invention. Transistor 70 includes a germanium crystal element 72 having a relatively large region 74 of donor impurity doped germanium, and two spaced regions 76 and 78 of acceptor impurity doped P-type germanium. Regions 76 and 78 are contacted by an emitter whisker element 80 and a collector whisker element 82, respectively, each of these whisker elements including atoms of the acceptor impurity utilized for establishing regions 76 and 78. Region 74 of crystal element 72, on the other hand, is ohmically connected to a metallic conductive base electrode 84, substantially as shown.

Point contact transistors produced according to the methods of this invention exhibit excellent electrical characteristics and high current multiplication in addition to the good frequency response which is characteristic of point contact semiconductor devices.

What is claimed as new is:

1. In a point contact semiconductor device, a whisker element comprising: a resilient molybdenum wire, said wire being pointed at one end; and a layer of indium in elemental form plated over at least said pointed end.

2. A resilient whisker element for a point contact semiconductor device, said whisker element including a central longitudinal region composed of molybdenum and a surface region surrounding said central region, said surface region being composed of an alloy of molybdenum and indium.

3. In a semiconductor device of the point contact type, the combination comprising: an N-type germanium crystal element; a resilient whisker element in point contact with said crystal element, said whisker element consisting of a molybdenum core and a region of indium in elemental form, said molybdenum core being pointed at one end thereof, said indium region being of substantial thickness surrounding and affixed to said molybdenum core including said pointed end; and a P-type indium-doped germanium degion within said N-type germanium crystal element immediately adjacent the contact point between said crystal element and said indium region of said whisker element.

4. In a semiconductor device of the point contact type, the combination comprising; an N-type germanium crystal element; a resilient whisker element in point contact with said crystal element, said whisker element consisting of a molybdenum core and a region of gallium in elemental form, said molybdenum core being pointed at one end thereof, said gallium region being of substantial thickness surrounding and affixed to said molybdenum core including said pointed end; and a P-type gallium-doped germanium region within said N-type germanium crystal element immediately adjacent the contact point between said crystal element and said gallium region of said whisker element.

5. In a semiconductor device of the point contact type, the combination comprising: an N-type germanium crystal element; a resilient whisker element in point contact with said crystal element, said whisker element consisting of a molybdenum core and a region of elemental indium surrounding and affixed to said molybdenum core, said molybdenum core being pointed at one end thereof, said indium region being an electroplated region of elemental indium deposited upon said molybdenum core including said pointed end to a depth of the order of at least .0001 inch; and a P-type indium-dope germanium region within said N-type germanium crystal element immediately adjacent the contact point between said crystal element and said indium region of said whisker element.

6. In a semiconductor device of the point contact type, the combination comprising: an N-type germanium crystal element; a resilient whisker element in point contact with said crystal element, said whisker element consisting of a molybdenum core and a region of elemental gallium surrounding and affixed to said molybdenum core, said molybdenum core being pointed at one end thereof, said gallium region being a region of elemental gallium deposited upon said molybdenum core including said pointed end to a depth of the order of at least .0001 inch by dipping said molybdenum core in molten gallium; and a P-type gallium-doped germanium region within said N-type germanium crystal element immediately adjacent the contact point between said crystal element and said gallium region of said whisker element.

7. The method of producing a whisker element for use in a point contact semiconductor device, said method including the steps of: forming a point at one end of a molybdenum whisker, and electroplating a layer of indium in elemental form upon said molybdenum whisker, said indium being plated to a depth sufficient to form a region of elemental indium surrounding and affixed to said whisker element including said pointed end thereof.

8. In a point contact semiconductor device, the combination comprising: a germanium semiconductor specimen having first and second surfaces; a resilient whisker element engaging said first surface of said specimen, said whisker element having a central region of molybdenum and a surface region surrounding said central region, said surface region consisting essentially of indium and molybdenum; a connecting electrode in ohmic contact with said second surface of said specimen; and a rectifying junction within said specimen and between said connecting electrode and said surface region of said whisker element.

References Cited in the file of this patent

UNITED STATES PATENTS

| | | |
|---|---|---|
| 2,524,035 | Bardeen et al. | Oct. 3, 1950 |
| 2,560,594 | Pearson | July 17, 1951 |
| 2,563,504 | Pfann | Aug. 7, 1951 |
| 2,644,852 | Dunlap | July 7, 1953 |
| 2,654,059 | Shockley | Sept. 29, 1953 |
| 2,671,156 | Douglas et al. | Mar. 2, 1954 |
| 2,680,220 | Starr et al. | June 1, 1954 |
| 2,697,269 | Fuller | Dec. 21, 1954 |
| 2,701,326 | Pfann et al. | Feb. 1, 1955 |

U. S. DEPARTMENT OF COMMERCE

PATENT OFFICE

CERTIFICATE OF CORRECTION

Patent No. 2,818,536 December 31, 1957

Justice N. Carman, Jr., et al.

It is hereby certified that error appears in the printed specification of the above numbered patent requiring correction and that the said Letters Patent should read as corrected below.

Column 6, line 56, for "metallic" read --mechanical--; column 7, line 28, strike out "Serial"; line 54, for "eleemnt" read --element--; column 8, line 67, after "multiplication" insert --$\alpha$--; column 9, line 42, for "dope" read --doped--.

Signed and sealed this 25th day of March 1958.

(SEAL)
Attest:

KARL H. AXLINE

Attesting Officer

ROBERT C. WATSON
Commissioner of Patents